United States Patent [19]

Monson et al.

[11] Patent Number: 4,875,019
[45] Date of Patent: Oct. 17, 1989

[54] RECEIVER PREAMPLIFIER WITH TUNED CIRCUIT ADAPTED FOR LORAN RECEPTION

[75] Inventors: Mark B. Monson; Thomas P. Blandino, both of Madison; Dennis E. Bahr, Middleton; Kendall E. Post, Madison, all of Wis.

[73] Assignee: Bahr Technologies, Inc., Madison, Wis.

[21] Appl. No.: 222,723

[22] Filed: Jul. 21, 1988

[51] Int. Cl.[4] .................. H03F 3/191; H03F 3/16
[52] U.S. Cl. ........................... 330/302; 330/300; 330/306
[58] Field of Search ............... 330/149, 165, 277, 302, 330/303, 304, 305, 306, 300; 455/227, 290

[56] References Cited

U.S. PATENT DOCUMENTS 4,559,503  12/1985  Camand et al. ................ 330/302
4,814,771  3/1989   Bahr et al. .................... 342/389

OTHER PUBLICATIONS

DeMaw, Doug, "Preamp for 80 & 160 Meter Loop and Beverage Antennas", QST, Aug. 1988, pp. 22-24.
A. E. Gaunt et al., "The AN/ARN-101 Loran Receiver", paper presented at W. G. A. Technical Symposium, Oct. 9, 1975.
Durk van Willigen, "Hard Limiting and Sequential Detecting Loran-C Sensor," Delft University Press, 1985, pp. 6-17 to 6-20.
Antenna Circuit Diagram for "PAL" Loran Receiver on the market in the United States prior to the filing date of the present patent application.
R. W. Burhans, "All About VLF Active Antennas," Radio-Electronics, Feb. 1983, pp. 63-66.
R. W. Burhans, "All About VLF Active Antennas—Part 2," Radio-Electronics, Mar. 1983, pp. 65-67, 72.
R. W. Burhans, "Build This VLF-HF Active Antennas—Part 3", Radio-Electronics, Apr. 1983, pp. 132-135.
R. W. Burchans, "Build This Passive Antenna Tuner for VLF-LF, Part 4", Radio-Electronics, May 1983, pp. 73-76.
E. H. Nordholt et al., "A New Approach to Active Antenna Design," IEEE Transactions on Antennas and Propagation, vol. Ap.-28, No. 6, Nov. 1980.
Radio Receiving Principles, p. 12-13, in The ARRL Handbook for the Radio Amateur, American Radio Relay League, 64th Edition, 1987.

Primary Examiner—Steven Mottola
Attorney, Agent, or Firm—Lathrop & Clark

[57] ABSTRACT

A preamplifier system adapted for a Loran receiver includes a buffer amplifier receiving the signal from the antenna at its input and a tuned circuit connected between the input of the buffer amplifier and ground. The tuned circuit includes a parallel combination of a resistance, capacitance and inductance with values selected such that a resonant frequency is provided substantially at or near the carrier frequency of the Loran signal to pass it while higher and lower frequencies, constituting extraneous noise signals, are substantially attenuated. In particular, low frequency, e.g. 60 Hz signals and DC from sources such as precipitation static, are shunted to ground through the parallel inductor in the tuned circuit so that these low frequency components do not affect the performance of the receiver. A secondary filter section is connected to the output of the buffer amplifier and has components that may be selected in value such that the overall transfer function of the preamplifier, including the tuned input circuit, has a desired bandpass characteristic. Thermal noise contributed by the parallel resistor in the tuned circuit may be reduced by feeding back the output of the buffer amplifier through the resistor to effectively reduce its noise contribution while leaving the effective input resistance the same. Notch filters may be incorporated with the input tuned circuit to reject strong extraneous signals within the passband.

39 Claims, 7 Drawing Sheets

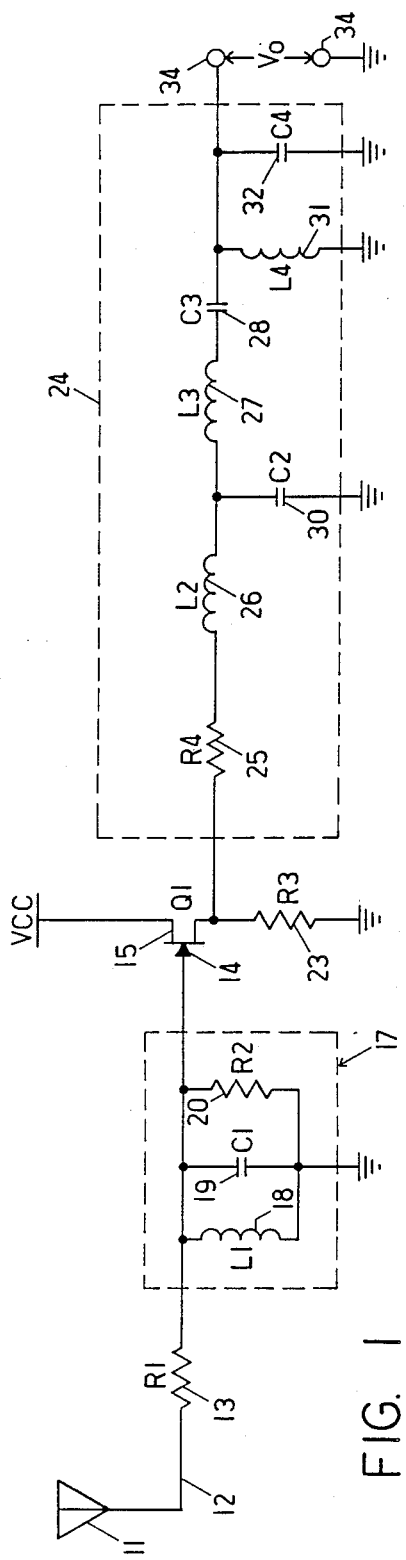
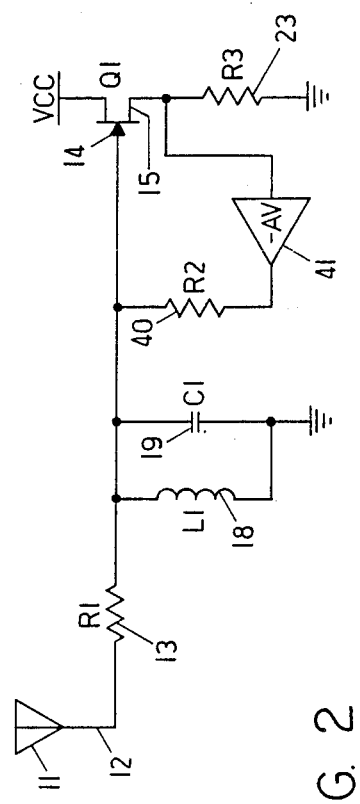
FIG. 1
FIG. 2

RECEIVER PREAMPLIFIER WITH TUNED CIRCUIT ADAPTED FOR LORAN RECEPTION

FIELD OF THE INVENTION

This invention pertains generally to the field of radio receivers and navigational equipment and particularly to preamplifier sections for Loran receivers.

BACKGROUND OF THE INVENTION

Loran-C is a system of radio navigation utilizing chains of geographically separated master and secondary transmitting stations which broadcast, in a precisely timed sequence, radio frequency pulses having a carrier frequency of substantially 100 kHz. Loran navigation has traditionally been utilized for ocean and lake navigation on boats that move relatively slowly and wherein antenna size is not a significant problem. A typical Loran-C receiver on a boat will use an antenna at least 4 feet long and preferably 8 feet long to maximize reception of the 100 kHz Loran carrier frequency signal. However, Loran is increasingly used in non-maritime applications, particularly on aircraft, and also in terrestrial navigation. A relatively long antenna is usually not feasible or convenient for use on aircraft or land vehicles or with a hand-held receiver. Loran receivers on aircraft now typically use an 18 inch antenna and a serially tuned input circuit connected to the antenna to pass the Loran C carrier frequency and to attenuate higher and lower frequencies outside the frequency band of interest. However, such aircraft receiver systems are observed to suffer from precipitation static (P-static) when the aircraft is flying through clouds, snow, or ice particles due to the series capacitor in the input circuit. In addition, such aircraft systems are not well suited for terrestrial navigation applications, because of the coupling of low frequency signals into the antenna from a user's hand, or from nearby equipment, which can seriously interfere with proper system operation. Such systems are also vulnerable to interference from near-band radio frequency sources, such as AM radio stations and 2 MHz marine radios. Series resonant input networks which have been designed to address these problems suffer from hand effect detuning and call for very large inductance values.

SUMMARY OF THE INVENTION

The receiver preamplifier system of the present invention utilizes a parallel tuned circuit to ground connected to the antenna which has a resonant frequency substantially at or near a particular carrier frequency of interest, such as the Loran-C carrier frequency, to pass signals of this frequency. The resonant tuned circuit acts effectively as a short circuit to ground from the antenna at DC to eliminate P-static, such as that generated by snow on the antenna of a moving vehicle, low frequency signals, e.g., 50/60 Hz, coupled to the antenna in hand-held systems or received from nearby AC power systems, and other frequencies outside the passband of interest, which extends approximately from 50 kilohertz to 150 kilohertz for LORAN receiver systems. The output of the tuned circuit is provided to a buffer amplifier, such as a junction field effect transistor, with the output of the buffer amplifier then being provided to a secondary filter section. The tuned circuit and the secondary filter section are designed to act together as a single band-pass filter section having the desired filtering characteristics for the Loran-C preamplifier. By effectively incorporating the input tuned circuit and the filter section downstream of the buffer amplifier into a single filter, the total filter attenuation is significantly reduced from conventional designs. Receiver designs which cascade pre-amp selectivity with a separate bandpass filter, exhibit as much as 18 dB more insertion loss compared to the present invention.

In the present system, the combination of a tuned circuit prior to any active components and a filter section immediately after the input buffer provides attenuation of adjacent channel interference that might otherwise cause intermodulation distortion or, for very strong interference signals, saturation or overloading of the receiver amplifier. For a LORAN-C system, this greatly reduces interference from near band sources, such as AM radio stations and marine radios.

The parallel resonant input circuit of the system preferably has a relatively low loaded Q (e.g., in the range of 3.5) which may be obtained by utilizing a resistor in parallel with the tuned circuit inductor and capacitor. To reduce the thermal noise contributed by the parallel resistor, negative feedback is utilized which provides "electronic cooling" (also known as active damping) of the parallel resistance. The desired effective parallel resistance is obtained by feeding back the amplified output of the input buffer to an input parallel resistor which has the noise contribution of a much smaller resistance. Because the thermal noise contribution of the resistor is proportional to the square root of its resistance, the desired low noise characteristics of the input network are preserved with a relative large effective input resistance.

Thus, a relatively short antenna, e.g., one 18 inches in length, can be utilized while still achieving receiver signal sensitivity and signal to noise ratio goals.

LORAN-C receivers require a relatively wide bandpass filter to accurately recover LORAN-C pulses A bandpass filter attenuates unneeded signals outside the band of interest to eliminate amplifier overloading, intermodulation distortion, etc. Ideally, it does nothing to signals within the passband Unfortunately, in some geographical locations, powerful transmitters, radio beacons, and other strong, narrow bandwidth interference sources may generate signals that lie within the passband and corrupt or compromise the LORAN-C signal, or they may fully overload receiver amplifiers, precluding LORAN-C reception. In a further embodiment of the invention, a notch filter is incorporated with the tuned circuit by which narrow band interferers may be attenuated within the passband of the LORAN-C receiver without seriously distorting the overall amplitude and phase characteristics of the receiver bandpass filter.

Further objects, features and advantages of the invention will be apparent from the following detailed description when taken in conjunction with the accompanying drawings.

BRIEF DESCRIPTION OF THE DRAWINGS

In the drawings:

FIG. 1 is a circuit schematic of a Loran preamplifier section having a parallel tuned circuit in accordance with the present invention.

FIG. 2 is a circuit schematic of a portion of the circuit of FIG. 1 with the addition of feedback to provide electronic cooling of the parallel resistor in the tuned circuit.

DESCRIPTION OF THE PREFERRED EMBODIMENTS

Figure 3:
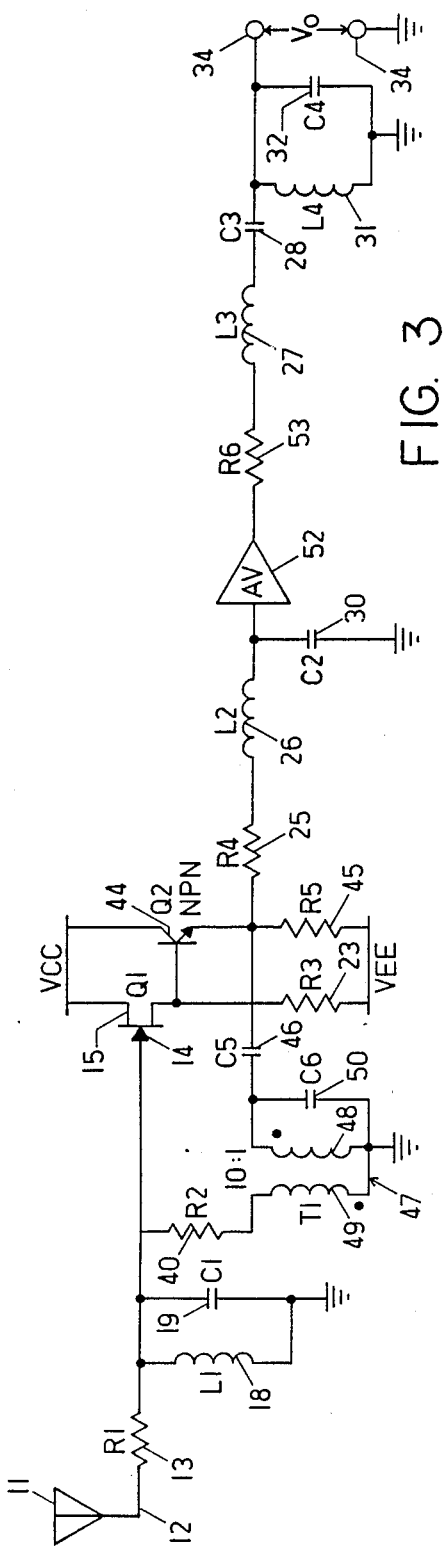
FIG. 3 is a circuit schematic of an implementation of the circuit of FIG. 1 having electronic cooling of the parallel tuned circuit resistor with feedback voltage gain provided by a transformer.

With reference to the drawings, a schematic circuit diagram of a Loran-C preamplifier system having a tuned resonant circuit in accordance with the invention is shown in FIG. 1. Radio waves are picked up by an antenna 11 and converted to an electrical signal on an input line 12 leading to the preamplifier section of the present invention. It is a particular advantage of the present invention that the antenna 11 may be relatively short, for example having a length of about 18 inches which is conventional in Loran equipment for aircraft, while still providing insensitivity to precipitation static and low frequency or DC coupling, low input attenuation, and greatly reduced interference from near-band sources such as AM radio stations and marine radios. The electrical signal on the input line 12 is passed through an input series resistor 13, which serve to receive the signal from the antenna, and the resistor is connected to the input gate 14 of a junction field effect transistor (JFET) 15 which acts as a buffer amplifier. The JFET 15 is selected to have low noise as well as a very high input impedance at the gate 14. A tuned resonant circuit 17, composed of a parallel connected inductor 18, capacitor 19, and resistor 20, is electrically connected between the gate 14 and ground. The capacitance of the low noise JFET is "tuned out" by effectively combining it with the tuned circuit. The series resistor 13 provides a pole outside the pass band to reduce the amplitude of high frequencies picked up by the antenna 11. The JFET 15 provides high impedance buffering to the input signal and has its source connected to ground through a resistor 23. The output of the buffer transistor 15 at the source is provided to a secondary filter section shown within the dashed lines labeled 24 and illustrated as composed of, connected in series, a resistor 25, an inductor 26, an inductor 27 and a capacitor 28, a capacitor 30 connected between the junction of the inductors 26 and 27 and ground, and a parallel connected inductor 31 and capacitor 32, connected to ground, across which the output voltage $V_O$ is taken. The secondary filter section 24 may be selected to provide a desired number of poles and zeros to achieve the desired overall transfer function, as explained below.

The parallel to ground inductor 18 in the tuned circuit 17 provides an effective shunt to ground for DC and low frequency components picked up by the antenna, while the capacitor 19 acts as a shunt to ground for the very high frequency components. In this manner, charge picked up by the antenna, such as is developed when an airplane passes through a snowstorm, can be drained off to ground through the inductor 18. Very low frequency components such as 60 Hz power which could be coupled to the antenna from, for example, a user's hand in a hand-held unit, will also be effectively shunted to ground through the inductor 18. The values of the components of the tuned circuit 17 are chosen to provide pole locations that are desired for the overall transfer function of the circuit from the antenna 11 to the output terminals 34. A preferred procedure for carrying out this choice is described below.

First, the filter type and bandwidth is chosen. This is done based on a compromise between phase linearity, shape factor, group delay, and other considerations well known in the design of filters for Loran receivers. The filter may be a standard type, or the pole and zero locations can be derived from the magnitude and phase requirements. The transfer function is then converted to bandpass form if it is not in such form already. The bandpass transfer function is found in standard tables and scaled. The bandpass function can be derived by substituting the following substituted variable $S'$, defined as follows:

$$S' = \frac{S^2 + \omega_o^2}{BS}$$

into the low pass filter function. In this substitution, $\omega_0$ is the center frequency of the bandpass and B is the band-width. The band pass transfer function is then factored into complex pole pairs, and one set of poles is removed and the function multiplied back into standard form, i.e., into the form:

$$H(S) = \frac{S^n + Z_{n-1}S^{n-1} + \ldots Z_1S + Z}{S^n + P_{n-1}S^{n-1} + \ldots P_1S + P_0}$$

The transfer function is then divided by S to remove the zero added by the antenna capacitance. The secondary filter section is then synthesized from this transfer function which has been divided by S.

When the synthesized secondary filter section is cascaded with the input tuned circuit and the buffer amplifier JFET, the overall transfer function thus appears in the form of one continuous filter rather than two cascaded filters. Consequently, a much lower insertion loss is obtained for a given band-width and shape factor then would be obtained for two corresponding cascaded filters. Utilizing standard filter type designs, as much as an 18 dB improvement in insertion loss can be obtained. In the implementation of the synthesized secondary filter 24 shown in FIG. 1, the circuit provides a four pole (8 poles after the band pass transformation) bandpass filter with all zeros at the origin. A similar procedure can be applied to the secondary filter to break it up into buffered sections to optimize circuit or amplifier configurations.

One limitation of the circuit of FIG. 1 is that any noise generated within the tuned circuit 17 itself will be mixed with the weak signal from the antenna 11 and amplified by the amplification sections of the Loran receiver. The primary source of noise in the tuned circuit is thermal noise from the tuned circuit resistor 20. The noise power from this resistor is directly proportional to the resistance of the resistor, the value of which is selected to give the desired frequency or damping response characteristics for the tuned circuit 17. Although the effective resistance of the resistor is necessarily dictated by the design of the tuned circuit, the thermal noise from the resistor can be reduced by using "electronic cooling" of the resistor, in the manner illustrated in FIG. 2, which is a modified form of the portion of the circuit of FIG. 1 up to the buffer amplifier JFET 15, with the remaining portion of the circuit being identical to that of FIG. 1. The tuned circuit resistor 20 is replaced by the series combination of a resistor 40 and an inverting amplifier 41 having a gain of minus Av. The amplifier 41 is connected to the source of the FET 15 and feeds back the signal at the source through the resistor 40 which is connected to the gate 14 of the FET. To keep the same effective input impedance (as seen by the antenna) as in the circuit of FIG. 1, the resistance of the resistor 40 is increased in value with respect to the resistance of the resistor 20 by a factor Av+1. The circuit characteristics are thus unchanged, but the noise contribution from the parallel resistor in the tuned circuit is reduced by a factor of $1/\sqrt{Av+1}$ because the noise voltage generated by the resistor increases with the square root of the resistance.

A circuit diagram of an implementation of the preamplifier section of the present invention using electronic cooling is shown in FIG. 3. In this circuit, the function of the amplifier 41 of FIG. 2 is replaced by a bipolar transistor 44, which receives at its base the output from the source of the transistor 15 and which is biased by an emitter resistor 45, with the output from the emitter of the transistor 45 being provided through a coupling capacitor 46 to a transformer 47 having a primary coil 48 and secondary coil 49, the latter being connected to the resistor 40. A capacitor 50 is connected across the primary of the transformer 47. The transformer 47 provides the voltage gain Av, and the transistor 44 buffers the output of the FET to provide a low impedance drive to the transformer. Bipolar supply voltages $V_{cc}$ and $V_{ee}$ are provided across the transistors 15 and 44 to increase the signal swing. The capacitor 46 prevents the transformer from DC loading the transistor 44 and the capacitor 50 is chosen in value to resonate with the inductance of the primary 44 of the transformer 47 to increase the input impedance of the transformer. In the circuit of FIG. 3, the secondary filter section is synthesized to allow an amplifier 52 to be placed between the inductor 26 and the inductor 27, with an additional series resistor 53 connected to the output of the amplifier 52. The overall transfer function of the circuit has not been changed but the circuit can be implemented with more reasonable component values than the purely passive synthesized secondary filter section 24 of FIG. 1.

Figure 4:
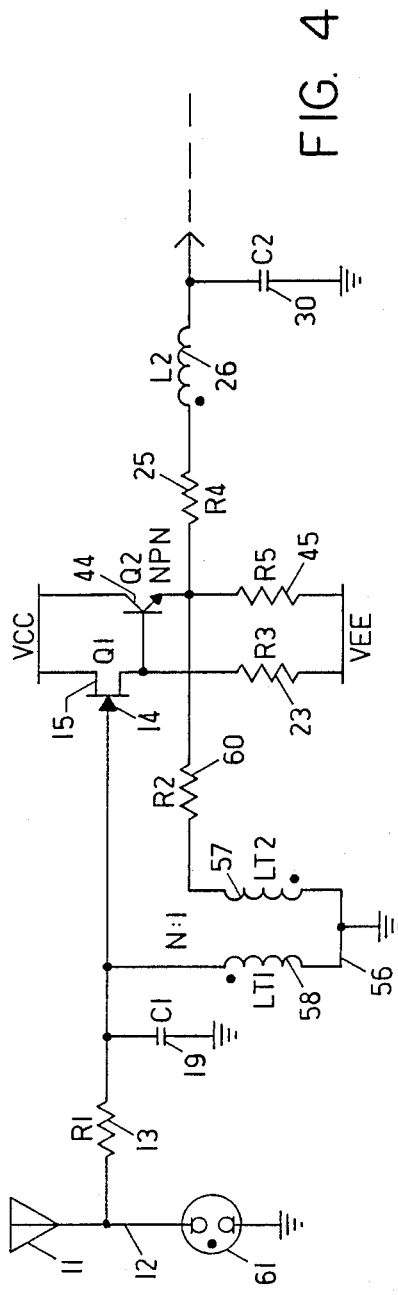
FIG. 4 is a circuit schematic of a portion of the circuit of FIG. 3 showing an alternate electronic cooling configuration.

An alternate electronic cooling configuration for this circuit is shown in FIG. 4. In this circuit, the function of the tuned circuit inductor 18 is performed by a transformer 56 having a primary winding 57 and a secondary 58. The transformer is driven by the emitter of the bipolar transistor 44 through a resistor 60. To leave the filter transfer function unchanged from the prior circuits, the impedance presented by the resistor 60 and the inductance of the secondary 58 of the transformer, as seen at the gate 14 of the FET 15, must be unchanged. To achieve this, the resistance of the resistor 60, $R_{2'}$, must be equal to:

$$R_2' = R_2\left(1 + \frac{1}{N}\right)\frac{M}{L_1}$$

where M is the mutual inductance between the primary and secondary transformer windings, $L_1$ is the inductance of the original circuit inductor 18, and N is the transformer turns ratio.

The noise reduction in the circuit of FIG. 4 is thus obtained in the same manner as in the circuit of FIG. 3 but utilizing fewer parts. In the circuit of FIG. 4, the effective resistance of the resistor 60 multiplied by the square of the turns ratio of the transformer 56 is bridged across the tuned network consisting of the capacitor 19 and the inductor 58. This effective resistance again reduces the loaded Q of the network. Because the thermal noise voltage of a resistor is directly proportional to the square root of its resistance, the noise at the gate of the FET 14 due to the resistor 60 is approximately one third that due to the resistor 20 of FIG. 1.

The following are examples of preferred component types and values for the circuit of FIG. 4 including the secondary filter section of FIG. 3:

Resistor 13—27K ohms
Capacitor 19—100 pF
Coil 58 inductance—20 mH
Coil 57 inductance—200μH
Resistor 60—4.45 K ohms
JFET 15—PF5102
Transistor 44—MPSA 18
Resistor 23—22 K ohms
Resistor 45—3.9 K ohms
Resistor 25—976 ohms
Inductor 26—5.22 mH
Capacitor 30—560 pF
Inductor 27—5.86 mH
Capacitor 28—440 pF
Inductor 31—750 μH
Capacitor 32—3.5 nF
Lamp 61—NE 2

As noted above, in some geographic locations powerful radio transmitters, radio beacons and other strong, narrow bandwidth interference sources can generate signals that lie within the LORAN-C passband. These signals can corrupt or compromise the LORAN-C signal, and, in some cases, they may be strong enough to fully overload the amplifier so that no LORAN-C reception is obtained. It is a particular advantage of the present invention that a notch filter can be incorporated with the input tuned circuit of the invention to attenuate these strong signals within the LORAN-C passband without seriously distorting the overall amplitude and phase characteristics of the receiver bandpass filter.

It is the general practice in LORAN-C receivers to employ "T" notch filters at positions relatively late in the receiver amplifier chain, after the preamplifier and other input circuitry, because the impedances required at these positions after preamplification are reasonable in value. However, because the interference rejecting notch filters are then located after the active amplifier and buffer stages, much of the advantages of these notch filters is lost. On the other hand, if series tuned notch filters are used prior to the buffer FET, such notch filters require impractically large inductors and unloaded inductor Qs. Consequently, notch filters have not generally been utilized in LORAN receivers prior to the input buffer amplifier. The present invention, however, provides a practical means of situating the notch filter or filters prior to the buffer amplifier but yet allowing the filters to be constructed with reasonable impedance values using practical components.

Figure 5:
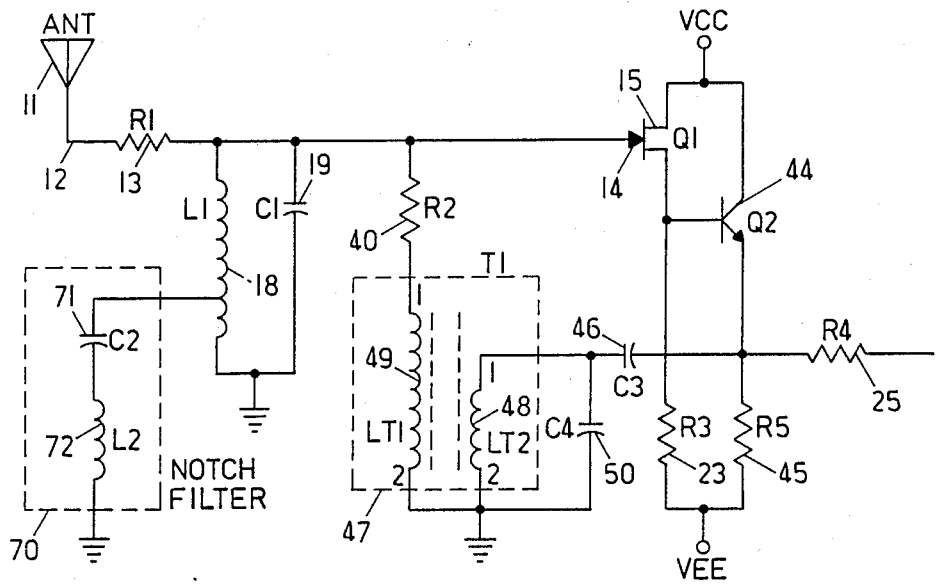
FIG. 5 is a circuit schematic of a further embodiment of the invention having a notch filter connected to the input tuned circuit.
Figure 6:
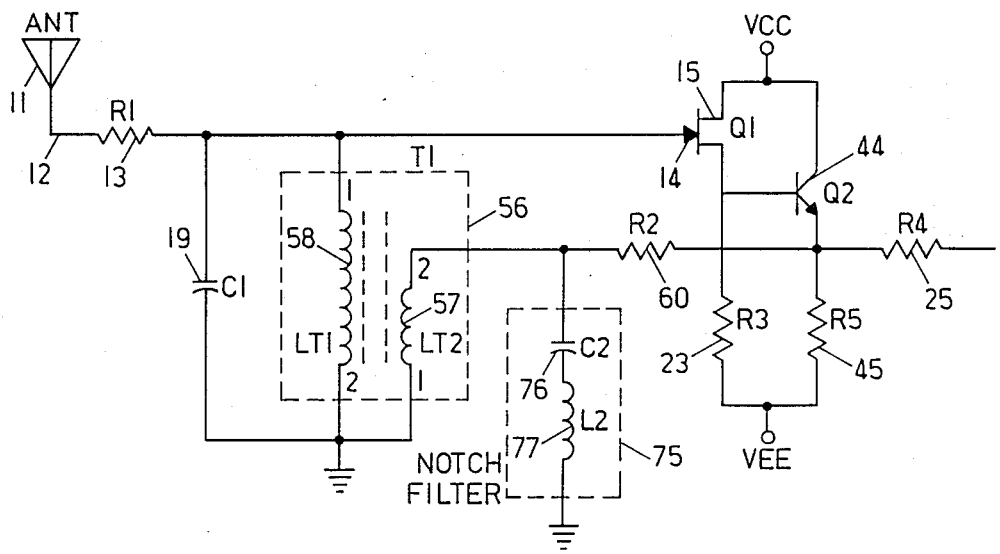
FIG. 6 is a circuit schematic of a further embodiment having a notch filter connected to the feedback transformer winding.

A first embodiment of the invention employing a notch filter is shown in FIG. 5, which is a modification of the circuit of FIG. 3. The notch filter 70 composed of a series connected capacitor 71 and an inductor 72, is connected to a tap on the input bandpass inductor 18. In the embodiment of FIG. 6, which is a modification of the circuit of FIG. 4, the notch filter 75, composed of series connected capacitor 76 and an inductor 77, is connected to the primary winding 57 of the feedback transformer 56. At series resonance, the filter networks 70 in FIG. 5 and 75 in FIG. 6, present a low impedance shunt across the antenna and the input to the FET 15.

Figure 7:
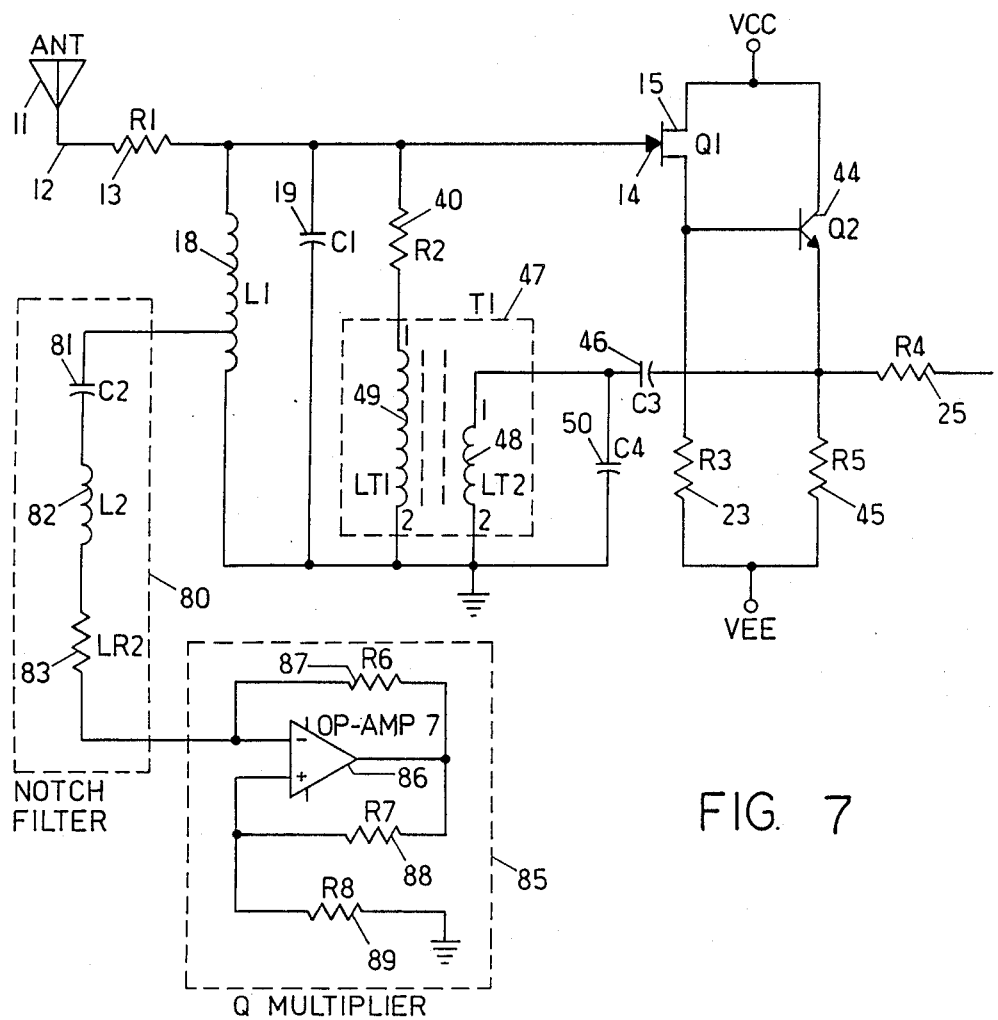
FIG. 7 is a circuit schematic of a circuit as in FIG. 5 with the addition of a Q multiplier.

The reduction of notch filter impedance makes it somewhat easier to achieve the needed unloaded Q. If it is desired to use inexpensive inductors, which generally have lower Qs, additional circuitry can be utilized. FIG. 7 illustrates a circuit similar to that of FIG. 5 wherein a notch filter 80, composed of series connected capacitor 81, inductor 82, and resistor 83, is connected to a tap off the tuned circuit inductor 18. A Q multiplier 85, composed of an operational amplifier 86, feedback resistors 87 and 88, and a series resistor to ground 89, is connected to the notch filter to boost the effective Q of the filter.

Figure 8:
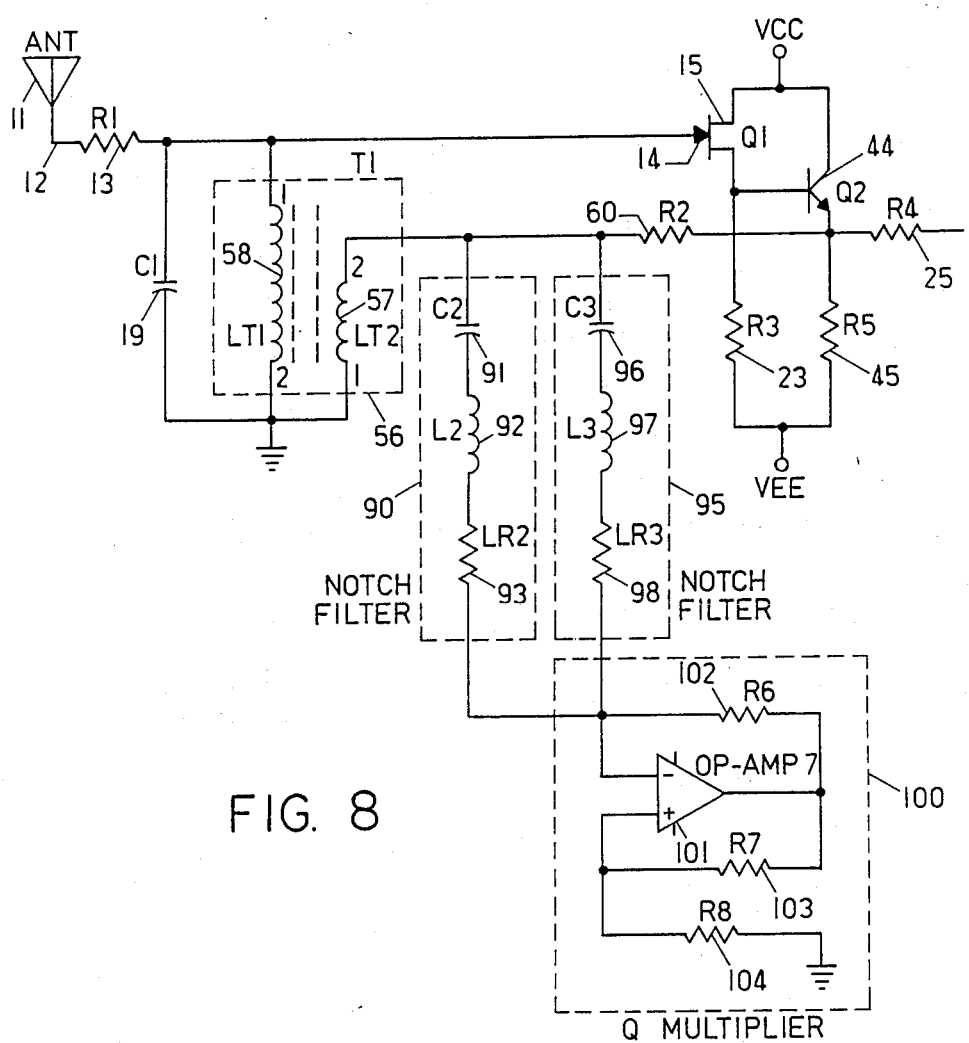
FIG. 8 is a circuit schematic of a circuit as in FIG. 6 with notch filters and a Q multiplier.

As illustrated in FIG. 8, which is a modification of the circuit of FIG. 4, multiple notch filters can be utilized. A notch filter 90, composed of series connected capacitor 91, inductor 92, and resistor 93, and a second notch filter 95, composed of series connected capacitor 96, conductor 97 and resistor 98, are connected together in shunt to the primary winding 57 of the feedback transformer 56. The two notch filters 90 and 95 can share a common Q multiplier 100 (composed of an operational amplifier 101, feedback resistors 102 and 103, and series resistor to ground 104) provided that the frequencies of the notch filters are sufficiently far apart.

Figure 9:
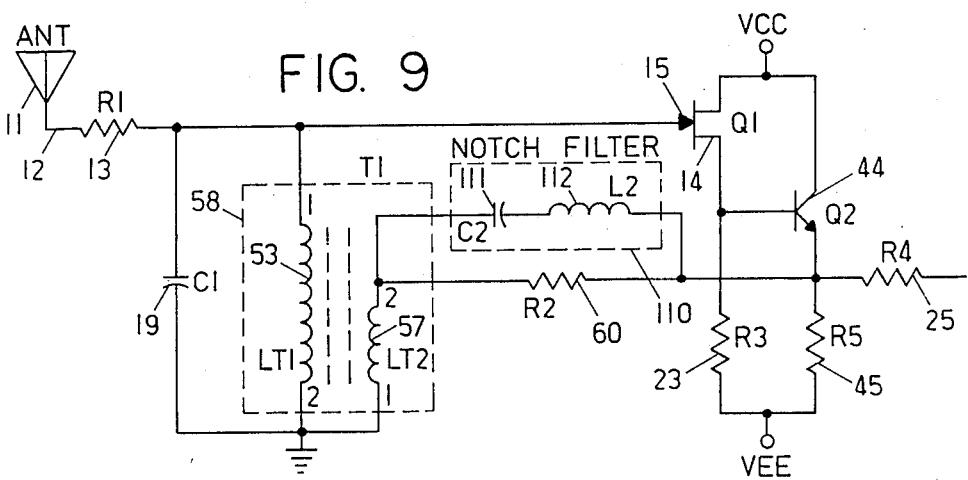
FIG. 9 is a circuit schematic of a further embodiment having a series feedback notch filter.
Figure 10:
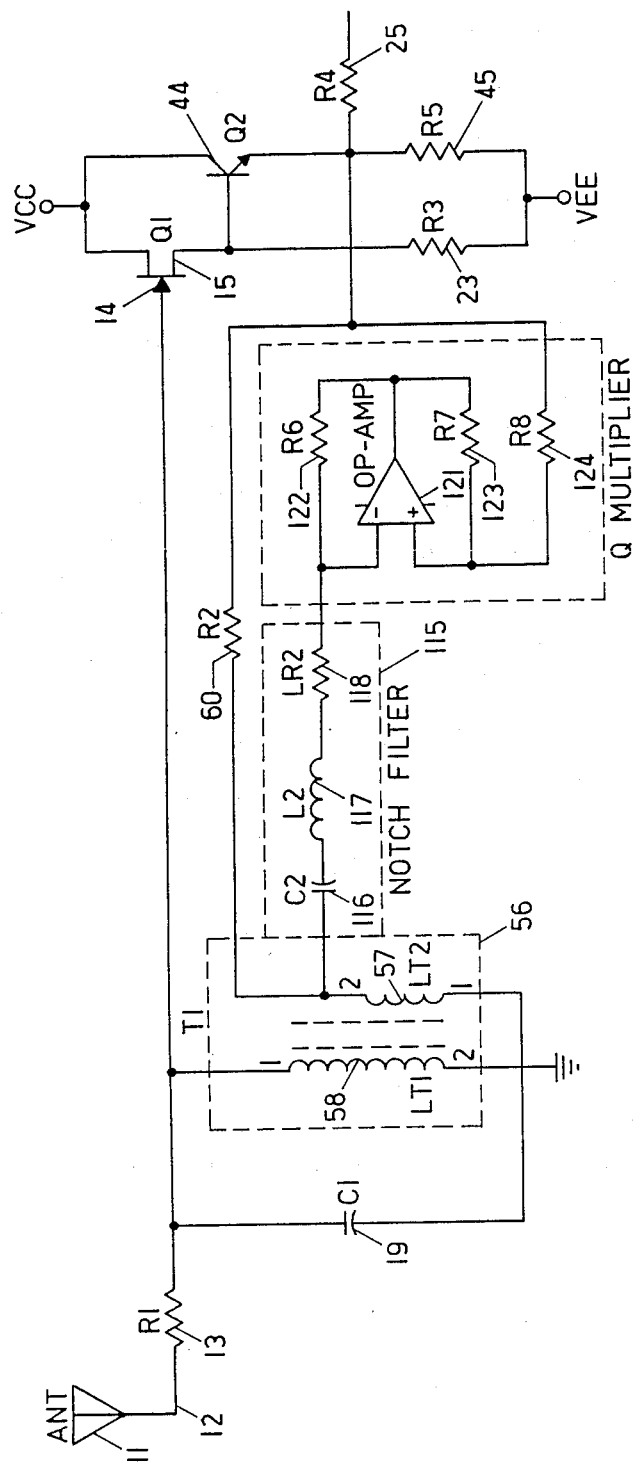
FIG. 10 is a circuit schematic of a circuit as in FIG. 9 with addition of a Q multiplier.

The circuits of FIGS. 5–8 have notch filters arranged to shunt interfering input signals to ground. FIGS. 9 and 10 illustrate series feedback shunt circuit configurations which can perform similar functions. In the circuit of FIG. 9, which is a modification of the circuit of FIG. 4, the notch filter 110, composed of a series connected capacitor 111 and an inductor 112, is connected across the feedback resistor 60. In the circuit of FIG. 10, the notch filter 115 (composed of a series connected capacitor 116, inductor 117 and resistor 118) is connected in series to a Q multiplier 120 (composed of an operational amplifier 121, feedback resistors 122 and 123 and series resistor 124), with the series combination of the notch filter 115 and the Q multiplier 120 connected across the feedback resistor 60.

Figure 11:
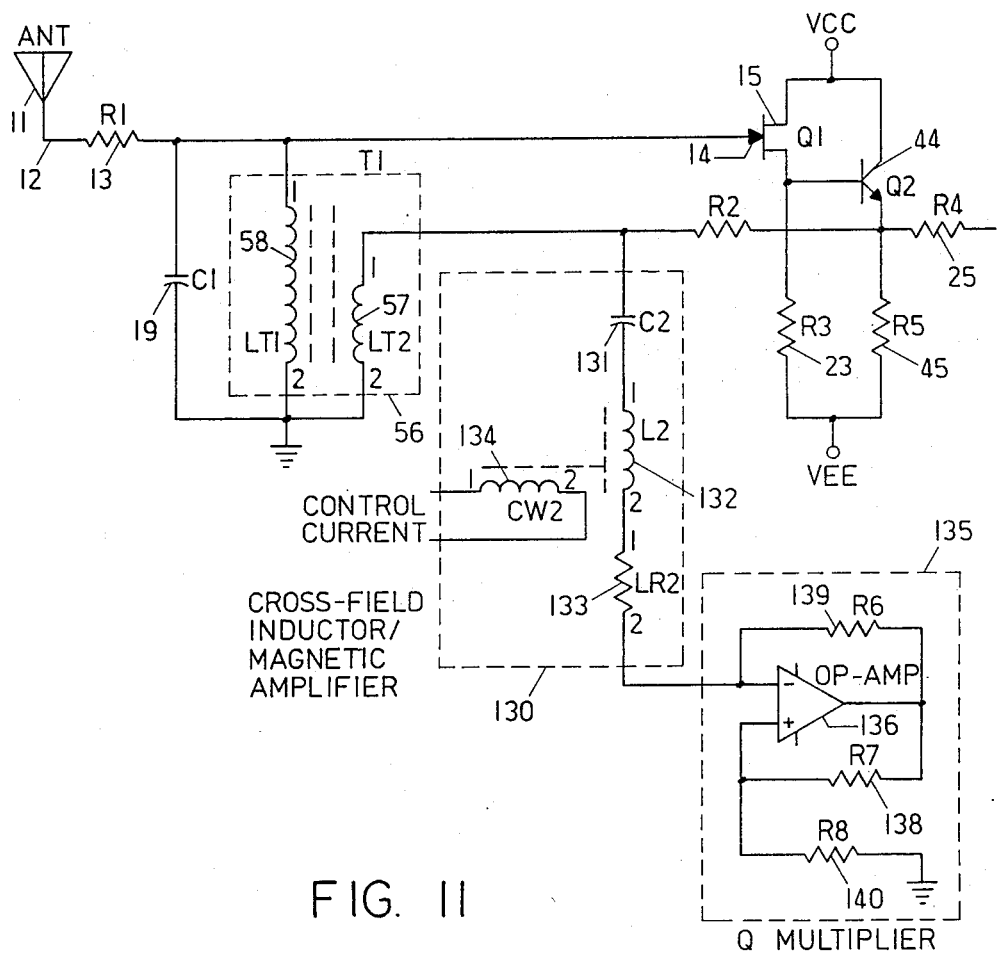
FIG. 11 is a circuit schematic of an embodiment having a notch filter connected to the feedback transformer winding and a Q multiplier, with a means provided for control of the notch frequency.

In the circuit of FIG. 11, which is a modification of the embodiment of FIG. 4, a notch filter 130, composed of series connected capacitor 131, inductor 132, and resistor 133, is connected in shunt to a Q multiplier 135, composed of operational amplifier 136, feedback resistors 137 and 138, and series resistor 139 to ground. The inductor 132 of the notch filter forms one of the windings of a Cross-field inductor/magnetic amplifier which is a coupled to a control winding 134. A control current may be provided from a control system source (not shown) to provide a desired current level through the winding 134 to control the effective inductance of the inductor 132 and thereby the effective notch frequency of the notch filter 130. This arrangement allows the notch frequency of the filter to be adjusted by the receiver system to supress a strong interfering signal within the LORAN-C passband which is at a frequency which is not necessarily known in advance.

It is understood that the invention is not confined to the particular embodiments set forth herein, but embraces such modified forms thereof as come within the scope of the following claims.

What is claimed is:

1. A preamplifier system for a receiver adapted to be connected to an antenna to receive a radio signal of a particular selected carrier frequency, such as a LORAN-C radio signal, and having a passband of frequencies which includes the selected carrier frequency, comprising:
    (a) input means for receiving the signal from the antenna;
    (b) a high input impedance buffer amplifier with an input and output and having its input connected to the input means;
    (c) a parallel tuned circuit connected between the input to the buffer amplifier and ground, the tuned circuit comprising the parallel combination of an inductance, capacitance and resistance, the values of which are selected to provide a resonant frequency which will pass the carrier frequency of the particular signal to be received; and
    (d) a secondary filter section connected to the output of the buffer amplifier.

2. The preamplifier system of claim 1 wherein the secondary filter section has filter components which are selected in value such that the overall filter characteristic of the preamplifier system including the the parallel tuned circuit provides a desired overall bandpass characteristic.

3. The preamplifier system of claim 1 including means for feeding back the output of the buffer/amplifier through the resistance of the tuned circuit to reduce the effective thermal noise contribution of the tuned circuit resistance.

4. The preamplifier system of claim 3 wherein the means for feeding back the output of the buffer amplifier includes a transformer having primary and secondary windings and means for connecting the output signal from the buffer amplifier to the primary and for connecting the secondary to the tuned circuit resistance, and with the turns ratio of the transformer selected to provide a desired amplification of the voltage level of the output of the buffer amplifier.

5. The preamplifier system of claim 1 wherein the buffer amplifier comprises a junction field effect transistor with the input signal to the amplifier being provided to the gate of the transistor.

6. The preamplifier system of claim 1 wherein the input means includes a resistor connected in series from the antenna to the input to the buffer amplifier to add a pole outside the passband of the preamplifier system.

7. The preamplifier system of claim 1 wherein the tuned circuit inductance comprises an inductor connected between the input to the buffer amplifier and ground, and further including a notch filter connected to a tap in the tuned circuit inductor and having a notch frequency within the passband of the preamplifier system.

8. The preamplifier system of claim 4 further including a notch filter connected between the primary of the feedback transformer and ground and having a notch frequency within the passband of the preamplifier system.

9. The preamplifier system of claim 4 further including a notch filter connected between the output of the buffer amplifier and the primary of the feedback transformer and having a notch frequency within the passband of the preamplifier system.

10. The preamplifier system of claim 7, 8, or 9 including means for increasing the Q of the notch filter.

11. The preamplifier system of claim 1 wherein the values of the tuned circuit inductance, capacitance and resistance are selected to provide a resonant frequency selected to pass the carrier frequency of LORAN-C.

12. The preamplifier system of claim 3 wherein the means for feeding back the output of the buffer amplifier includes a transformer having primary and secondary windings and wherein the resistance of the tuned circuit is provided on the primary side of the transformer by a resistor connected between the output of the buffer amplifier and the primary of the transformer, and wherein the secondary of the transformer is connected to the input to the buffer amplifier, and wherein the inductance of the tuned circuit is provided by the transformer.

13. A preamplifier system for a receiver adapted to be connected to an antenna to receive a radio signal of a particular selected carrier frequency, such as a LORAN-C radio signal, and having a passband of frequencies which includes the selected carrier frequency, comprising:
   (a) input means for receiving the signal from the antenna;
   (b) a high input impedance buffer amplifier with an input and output and having its input connected to the input means;
   (c) a parallel tuned circuit connected between the input to the buffer amplifier and ground, the tuned circuit comprising the parallel combination of an inductance, capacitance and resistance, the values of which are selected to provide a resonant frequency which sill pass the carrier frequency of the particular signal to be received; and
   (d) means for feeding back the output of the buffer amplifier through the parallel resistance of the tuned circuit to reduce the effective thermal noise contribution of the tuned circuit resistant.

14. The preamplifier system of claim 13 wherein the resistance of the tuned circuit is provided by a resistor connected to the input of the buffer amplifier and wherein the means for feeding back the output of the buffer amplifier includes an operational amplifier connected between the output of the buffer amplifier and the tuned circuit resistor.

15. The preamplifier system of claim 13 wherein the resistance of the tuned circuit comprises a resistor connected to the input of the buffer amplifier and wherein the means for feeding back the output of the buffer amplifier includes a transformer having primary and secondary windings, the secondary of the transformer connected to the tuned circuit resistor, and the primary of the transformer connected to the output of the buffer amplifier, the turns ratio of the transformer selected to provide a desired amplification of the voltage level of the output of the buffer amplifier.

16. The preamplifier system of claim 15 including amplification means, connected between the output of the buffer amplifier and the primary of the transformer, for providing output impedance isolation of the signal from the buffer amplifier before it supplied to the primary of the transformer.

17. The preamplifier system of claim 13 wherein the means for feeding back the output of the buffer amplifier includes a transformer having primary and secondary windings and wherein the resistance of the tuned circuit is provided on the primary side of the transformer by a resistor connected between the output of the buffer amplifier and the primary of the transformer and wherein the secondary of the transformer is connected to the input to the buffer amplifier, and wherein the inductance of the tuned circuit is provided by the transformer.

18. The preamplifier system of claim 13 wherein the input means includes a resistor connected in series from the antenna to the input to the buffer amplifier to add a pole outside the passband.

19. The preamplifier system of claim 18 wherein the values of the tuned circuit inductance, capacitance and resistance are selected, with the resistance of the series resistor of the input means, to provide a resonant frequency which will pass the carrier frequency of LORAN-C.

20. The preamplifier system of claim 13 wherein the tuned circuit inductance comprises an inductor connected between the input to the buffer amplifier and ground, and further including a notch filter connected to a tap in the tuned circuit inductor and having a notch frequency within the passband of the preamplifier system.

21. The preamplifier system of claim 15 including a notch filter connected between the primary of the feedback transformer and ground and having a notch frequency within the passband of the preamplifier system.

22. The preamplifier system of claim 15 further including a notch filter connected between the output of the buffer amplifier and the primary of the feedback transformer and having a notch frequency within the passband of the preamplifier system.

23. The preamplifier system of claim 17 including a notch filter connected between the primary of the transformer and ground and having a notch frequency within the passband of the preamplifier system.

24. The preamplifier system of claim 17 including a notch filter connected in parallel with the resistor which is connected between the output of the buffer amplifier and the transformer primary, the notch filter having a notch frequency within the passband of the preamplifier system.

25. The preamplifier system of claim 20, 21, 22, 23 24 including means for increasing the Q of the notch filter.

26. A preamplifier system for a receiver adapted to be connected to an antenna to receive a radio signal of a particular selected carrier frequency, such as a LORAN-C radio signal, and having a passband of frequencies which includes the selected carrier frequency, comprising:
   (a) input means for receiving the signal from the antenna;

(b) a high input impedance buffer amplifier with an input and output and having its input connected to the input means;

(c) a parallel tuned circuit connected between the input to the buffer amplifier and ground, the tuned circuit comprising the parallel combination of an inductance, capacitance and resistance, the values of which are selected to provide a resonant frequency which will pass the carrier frequency of the particular signal to be received; and (d) a notch filter connected to the tuned circuit and having a notch frequency within the passband of the preamplifier system.

27. The preamplifier system of claim 26 including means for feeding back the output of the buffer amplifier through the resistance of the tuned circuit to reduce the effective thermal noise contribution of the tuned circuit resistance.

28. The preamplifier system of claim 27 wherein the resistance of the tuned circuit is provided by a resistor connected to the input of the buffer amplifier and wherein the means for feeding back the output of the buffer amplifier comprises an operational amplifier connected between the output of the buffer amplifier and the tuned circuit resistor.

29. The preamplifier system of claim 27 wherein the resistance of the tuned circuit comprises a resistor connected to the input of the buffer amplifier and wherein the means for feeding back the output of the buffer amplifier includes a transformer having primary and secondary windings, the secondary of the transformer connected to the tuned circuit resistor, and the primary of the transformer connected to the output of the buffer amplifier, the turns ratio of the transformer selected to provide a desired amplification of the voltage level of the output to the buffer amplifier.

30. The preamplifier system of claim 29 including amplification means, connected between the output of the buffer amplifier and the primary of the transformer, for providing output impedance isolation of the signal from the buffer amplifier before it supplied to the primary of the transformer.

31. The preamplifier system of claim 27 wherein the means for feeding back the output of the buffer amplifier includes a transformer having primary and secondary windings and wherein the resistance of the tuned circuit is provided on the primary side of the transformer by resistor connected between the output of the buffer amplifier and the primary of the transformer and wherein the secondary of the transformer is connected to the input of the buffer amplifier, and wherein the inductance of the tuned circuit is provided by the transformer.

32. The preamplifier system of claim 26 wherein the input means includes a resistor connected in series from the antenna to the input to the buffer amplifier to add a pole outside the passband.

33. The preamplifier system of claim 32 wherein the values of the tuned circuit inductance, capacitance and resistance are selected, with the resistance of the series resistor of the input means, to provide a resonant frequency which will pass the carrier frequency of LORAN-C.

34. The preamplifier system of claim 26 wherein the tuned circuit inductance comprises an inductor connected between the input to the buffer amplifier and ground, and further including a notch filter connected to a tap in the tuned circuit inductor and having a notch frequency within the passband of the preamplifier system.

35. The preamplifier system of claim 29 including a notch filter connected between the primary of the feedback transformer and ground and having a notch frequency within the passband of the preamplifier system.

36. The preamplifier system of claim 29 including a notch filter connected between the output of the buffer amplifier and the primary of the feedback transformer and having a notch frequency within the passband of the preamplifier system.

37. The preamplifier system of claim 31 including a notch filter connected between the primary of the feedback transformer and ground and having a notch frequency within the passband of the preamplifier system.

38. The preamplifier system of claim 31 including a notch filter connected between the output of the buffer amplifier and the primary of the feedback transformer and having a notch frequency within the passband of the preamplifier system.

39. The preamplifier system of claim 34, 35, 36, 37 or 38 including means for increasing the Q of the notch filter.

* * * * *